(12) United States Patent
Regev (10) Patent No.: US 7,991,947 B2
(45) Date of Patent: Aug. 2, 2011

(54) MULTI-PRIORITY ENCODER

(75) Inventor: Zvi Regev, West Hills, CA (US)

(73) Assignee: Micron Technology, Inc., Boise, ID (US)

( * ) Notice: Subject to any disclaimer, the term of this patent is extended or adjusted under 35 U.S.C. 154(b) by 1415 days.

(21) Appl. No.: 10/330,204

(22) Filed: Dec. 30, 2002

(65) Prior Publication Data

US 2004/0125808 A1    Jul. 1, 2004

(51) Int. Cl.
*G06F 13/00*    (2006.01)

(52) U.S. Cl. ............... 711/108; 711/E12.097; 341/160

(58) Field of Classification Search .............. 341/160; 370/395.42, 455; 711/108
See application file for complete search history.

(56) References Cited

U.S. PATENT DOCUMENTS

| | | | | |
|---|---|---|---|---|
| 3,634,829 A | * | 1/1972 | Campi et al. ................. | 711/108 |
| 6,307,767 B1 | * | 10/2001 | Fuh ................................ | 365/49 |
| 6,462,694 B1 | * | 10/2002 | Miyatake ...................... | 341/160 |
| 6,693,814 B2 | * | 2/2004 | McKenzie et al. ............. | 365/49 |

* cited by examiner

*Primary Examiner* — Reginald G Bragdon
*Assistant Examiner* — Victor W Wang
(74) *Attorney, Agent, or Firm* — Dickstein Shapiro LLP (57) ABSTRACT

A multi-priority encoder includes a plurality of interconnected, single-priority encoders arranged in descending priority order. The multi-priority encoder includes circuitry for blocking a match output by a lower level single-priority encoder if a higher level single-priority encoder outputs a match output. Match data is received from a content addressable memory, and the priority encoder includes address encoding circuitry for outputting the address locations of each highest priority match line flagged by the highest priority indicator. Each single-priority encoder includes a highest priority indicator which has a plurality of indicator segments, each indicator segment being associated with a match line input.

16 Claims, 5 Drawing Sheets

MULTI-PRIORITY ENCODER

BACKGROUND OF THE INVENTION

1. Field of the Invention

The present invention relates to content addressable memories, and more specifically, to a content addressable memory having a multi-stage priority encoder for encoding multiple matches in a content addressable memory.

2. Brief Description of the Related Art

Priority encoders are electronic logic circuits that determine which of a number of inputs has the highest or lowest priority. Priority encoders are used in a variety of computer systems, as well as other applications. Priority encoders can be utilized in conjunction with content addressable memory (CAM), for example.

Modern communications systems transmit data over digital networks. System resources are finite, so allocation of those resources becomes necessary. For example, system capacity limitations may restrict the amount of data that can be transmitted by the network, or a user may wish to give priority to certain categories of data over others.

Practically all digital networks make use of some form of packet or block type data format to dynamically route data packets or blocks through the network. The data contained in the packets can be categorized in various ways, including type of packet, packet content, size, creation date, and urgency of delivery, for example. Depending on the purpose of the communications system and the preferences of the user, it may be necessary to limit or expand the amount of bandwidth to be allocated to a particular category of data.

Content addressable memories (CAMs) are used in communications systems as search engines for routing paths in data network routers and switches. The packets being routed can be viewed as belonging to a particular category. Typically, a CAM issues a single search result that is independent of a packet category. Consequently, it is necessary for the user to handle bandwidth allocation, for example, by discarding search results for certain categories. A significantly more efficient way of utilizing a CAM as a search engine is needed.

CAM can be used to perform fast address searches. For example, Internet routers often include a CAM for searching an address containing specified data. Thus, CAMs allow routers to perform high speed address searches to facilitate more efficient communication between computer systems over computer networks. Besides routers, CAMs are also utilized in such areas as databases, network adapters, image processing, voice recognition applications, and others.

In contrast to random access memory (RAM), which returns data in response to requests, CAM returns an address where the requested data is located. In a typical application, a CAM memory array generates a number of match signals on a match line in response to a request. The match signals are provided to a priority encoder to determine the address corresponding to the highest priority match. In a typical application, a priority encoder can determine the highest priority match from among 128K match inputs.

Figure 1:
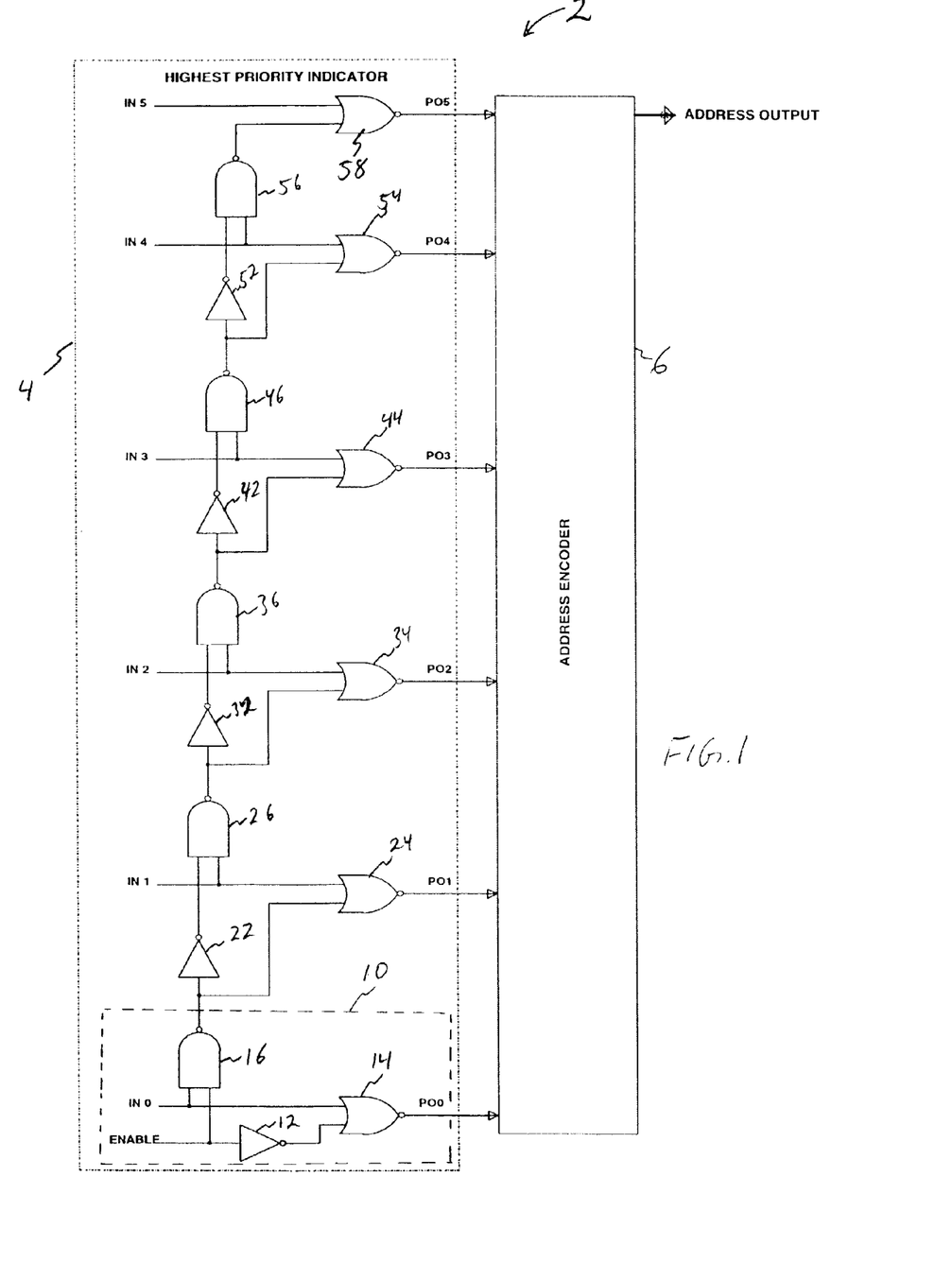
FIG. 1 illustrates an embodiment of a known priority encoder.

Referring to FIG. 1, a typical priority encoder 2 is illustrated. Priority encoder 2 includes a highest priority indicator (HPI) 4 and an address encoder 6. The operation of HPI 4 can be likened to a "thermometer" for determining which of the match results has the highest priority. Conventionally, match inputs from respective match lines in a CAM are applied to terminals IN0-IN5 of HPI 2. An ENABLE signal is provided. When multiple matches are encountered, the match line located on the lowest segment of the HPI is given the highest priority, by convention, as described further below. The match line that indicates a match on inputs IN0-IN5 and which has the highest priority will cause the lowest output terminal PO0-PO5 to change states, indicating a match.

As shown in FIG. 1, HPI 4 utilizes an arrangement of logic gates to determine which of the inputs has the highest priority. Each stage of HPI 4 includes an inverter, a NAND gate, and a NOR gate. A highest priority segment 10 includes inverter 12 which inverts the ENABLE signal, and supplies it to NOR gate 14. NOR gate 14 also receives a signal on match line input IN0. ENABLE is supplied to NAND gate 16, along with match line input IN0. The result from NOR gate 14 is supplied on output terminal PO0. Output terminal PO0 supplies the match signal from the highest priority stage to address encoder 6.

HPI 2 includes six priority stages, each stage having a successively lower priority. Thus, the signal from NAND gate 16 is supplied to the next logically lowest priority stage (physically higher on the "thermometer," as shown in FIG. 1) formed similarly of inverter 22, NOR gate 24, and NAND gate 26. NOR gate 24 supplies a signal to output terminal PO1, and NAND gate 26 supplies its signal to the third lowest priority stage formed of inverter 32, NOR gate 34, and NAND gate 36. A similar fourth-lowest priority stage is shown which includes inverter 42, NOR gate 44, and NAND gate 46. A similar fifth-lowest priority stage is shown which includes inverters 52, NOR gate 54, and NAND gates 56, providing an output signal on PO4 to address encoder 6. A final sixth stage includes NOR gate 58, providing its output signal on PO5.

In operation, matches supplied from a CAM (not shown) are indicated on match lines IN0-IN6 as logic 0, the ENABLE signal having a logic 1. Thus, in the first stage, if match line IN0 is low, output PO0 will be high, indicating a highest priority match. If match lines IN1, IN2, and IN3 are active low, output PO1 will produce a high signal, indicating a highest priority match. The remaining output signals PO0 and PO2-PO5 will be logic low.

In certain applications, it may be desirable to encode more than one highest priority input. For example, in CAMs, the comparand data bits are implemented such that a comparison can be made for a logic state of 1, a logic state of 0, or a "don't care" state wherein bits in the comparand register are masked as not to be involved in the matching search, and a match is declared regardless of what state is in the respective "don't care" bits in the CAM words. These "don't care" bits are used typically in a search known in the art as a search for the longest match. As a result of a search for the longest match, multiple words in the CAM may match the un-masked data bits in the comparand register. In such typical application, a special multi-match detection circuit indicates the presence of multiple matches. Using a typical prior art priority encoder, only one match, the one with the highest priority, is recorded. It is desirable, instead, to find the identity of all the matching words. In order to determine the next highest priority match, the user must discard the highest priority match, and re-encode the CAM match results to obtain the next highest priority match. Such manual manipulation of the CAM results is time consuming and inefficient.

A priority encoder is needed that can encode multiple matches in a CAM.

BRIEF SUMMARY OF THE INVENTION

The multi-priority encoder is formed of several "single" priority encoders interconnected to allow the first priority encoder to report the highest priority match, the second priority encoder to report the second priority match, etc.

DETAILED DESCRIPTION OF THE INVENTION

In the illustrative embodiments of the present invention, match inputs are active "LOW," wherein inputs which are not active are at a logic state of "1," and active inputs go to the state of "0." The multi-priority encoder is comprised of a succession of identical circuits known as "highest priority indicators" or "single priority encoders." In the circuits shown here, the first highest priority indicator generates an output indicating the first highest priority. The second highest priority indicator generates an output indicating the second highest priority. A third highest priority indicator generates an output indicating the third highest priority, etc.

Figure 2:
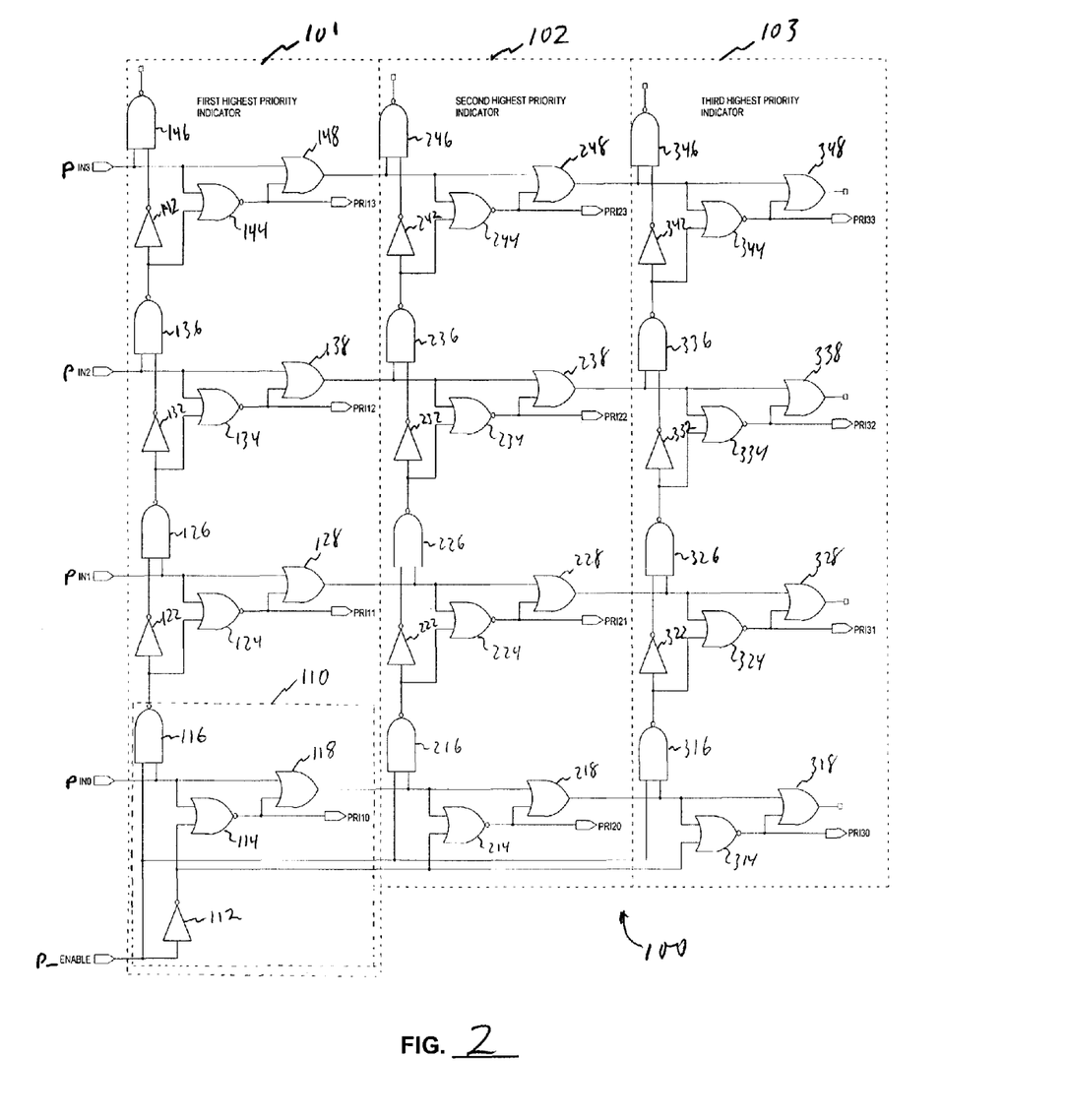
FIG. 2 illustrates a highest priority indicator according to an exemplary embodiment of the present invention.

FIG. 2 illustrates an exemplary embodiment of a multi-priority encoder 100 according to the present invention, in which three levels of priority are provided: first, second, and third. In the priority encoder of the present invention, priority has two dimensions: one dimension, vertical, within each of the single priority encoders, and another dimension, horizontal, between the three single-priority encoders.

Within a single highest priority indicator, the highest priority input is at the bottom, and the level of priority descends with the ascending inputs. Within the multi-priority encoder, the highest priority is given to the single priority encoder on the left, with a descending priority towards the right.

Any active output of a higher priority single-priority indicator leads to logic circuitry preventing an active output of the same vertical priority level in corresponding lesser priority single-priority indicators.

Referring to FIG. 2, priority encoder 100 includes three highest priority indicators (HPIs) 101, 102, and 103. The operation of HPIs 101-103 is like that of HPI 4 described above in connection with FIG. 1, and similarly can be likened to a "thermometer" for determining which of the match results has the highest priority. Match inputs from respective match lines in a CAM are applied to terminals PIN0-PIN3 of HPI 101. An P_ENABLE signal is provided. When multiple matches are encountered, the match line located on the lowest segment of HPI 101 is given the highest priority. The match line that indicates a match on inputs PIN0-PIN3 and which has the highest priority will cause the output on the corresponding terminal PRI10-PRI13 to change states, indicating a match.

As shown in FIG. 2, HPI 101 utilizes an arrangement of logic gates to determine which of the inputs has the first highest priority. Each stage of HPI 101 includes an inverter, a NAND gate, a NOR gate, and an OR gate. A highest priority segment 110 includes inverter 112 which inverts the ENABLE signal, and supplies it to NOR gate 114. NOR gate 114 also receives a signal on match line input PIN0. ENABLE is supplied to NAND gate 116, along with match fine input PIN0. The result from NOR gate 114 is supplied on output terminal PRI10, and to OR gate 118. Output terminal PRI10 supplies the match signal from the highest priority stage to an address encoder (not shown). The output of OR gate 118 is supplied to the highest priority stage of the second highest priority indicator 102.

HPI 101 includes four priority stages, each ascending stage in the vertical direction having a successively lower priority. Thus, the signal from NAND gate 116 is supplied to the next logically lower priority stage (physically higher on the "thermometer," as shown in FIG. 2) formed similarly of inverter 122, NOR gate 124, NAND gate 126, and OR gate 128. NOR gate 124 supplies a signal to output terminal PRI11, OR gate 128 passes its signal to the second highest priority stage of second highest priority indicator 102, and NAND gate 126 supplies its signal to the third lowest priority stage of first highest priority indicator 101. The third lowest priority stage of first highest priority indicator 101 similarly is formed of inverter 132, NOR gate 134, NAND gate 136, and OR gate 138. A similar fourth-lowest priority stage is shown which includes inverter 142, NOR gate 144, NAND gate 146, and OR gate 148. Additional lower priority stage are not shown, but are within the scope of the present invention.

In operation, matches supplied from a CAM (not shown) are indicated on match lines PIN0-PIN3 as logic 0, the ENABLE signal having a logic 1. Thus, in the first stage 110, if match line PIN0 is low, output PRI10 will be high, indicating a highest priority match. A logic 1, indicating no match, will be forwarded to the highest priority stage of second highest priority indicator 102, formed of NOR gate 214, NAND gate 216, and OR gate 218. A logic 1 similarly will be supplied to the highest priority stage of third highest priority indicator 103, formed of NOR gate 314, NAND gate 316, and OR gate 318. Thus, no further priority encoding effectively will take place in the current clock cycle for the signal of match line PIN0, and the output signals PRI20 and PRI30 will not indicate a match.

If, on the other hand, PIN0 indicates no match (logic 1) and match lines PIN1, PIN2, and PIN3 are active low, indicating a match on each line, output PRI11 will produce a high signal, indicating a highest priority match, and a logic 1 will be passed on to second highest priority stage of second highest priority indicator 102, formed of inverter 222, NOR gate 224, NAND gate 226, and OR gate 228. A logic 1 similarly will be supplied to the second highest priority stage of third highest priority indicator 103, formed of inverter 322, NOR gate 324, NAND gate 326, and OR gate 328. Thus, no further priority encoding effectively will take place in the current clock cycle for the signal of match line PIN1, and the output signals PRI21 and PRI31 will not indicate a match.

The remaining output signals PRI12 and PRI13 will be logic low, and logic low signals will be supplied to the third and fourth highest priority stages of second highest priority indicator 102. The third highest priority stage of second highest priority indicator 102, formed of inverter 232, NOR gate 234, NAND gate 236, and OR gate 238, generates a logic 1 on output PRI22, and supplies a logic 1 to the third highest priority stage of third highest priority indicator 103, formed of inverter 332, NOR gate 334, NAND gate 336, and OR gate 338.

The fourth highest priority stage of second highest priority indicator 102, formed of inverter 242, NOR gate 244, NAND gate 246, and OR gate 248, generates a logic 0 on output PRI23, and supplies a logic 0 to the third highest priority stage of third highest priority indicator 103, formed of inverter 342, NOR gate 344, NAND gate 346, and OR gate 348. The third match, originally supplied on match line PIN3, is indicated on output PRI33 as a logic 1. Additional fourth, fifth, etc. highest priority indicators, coupled similarly, are within the scope of the present invention.

Figure 3:
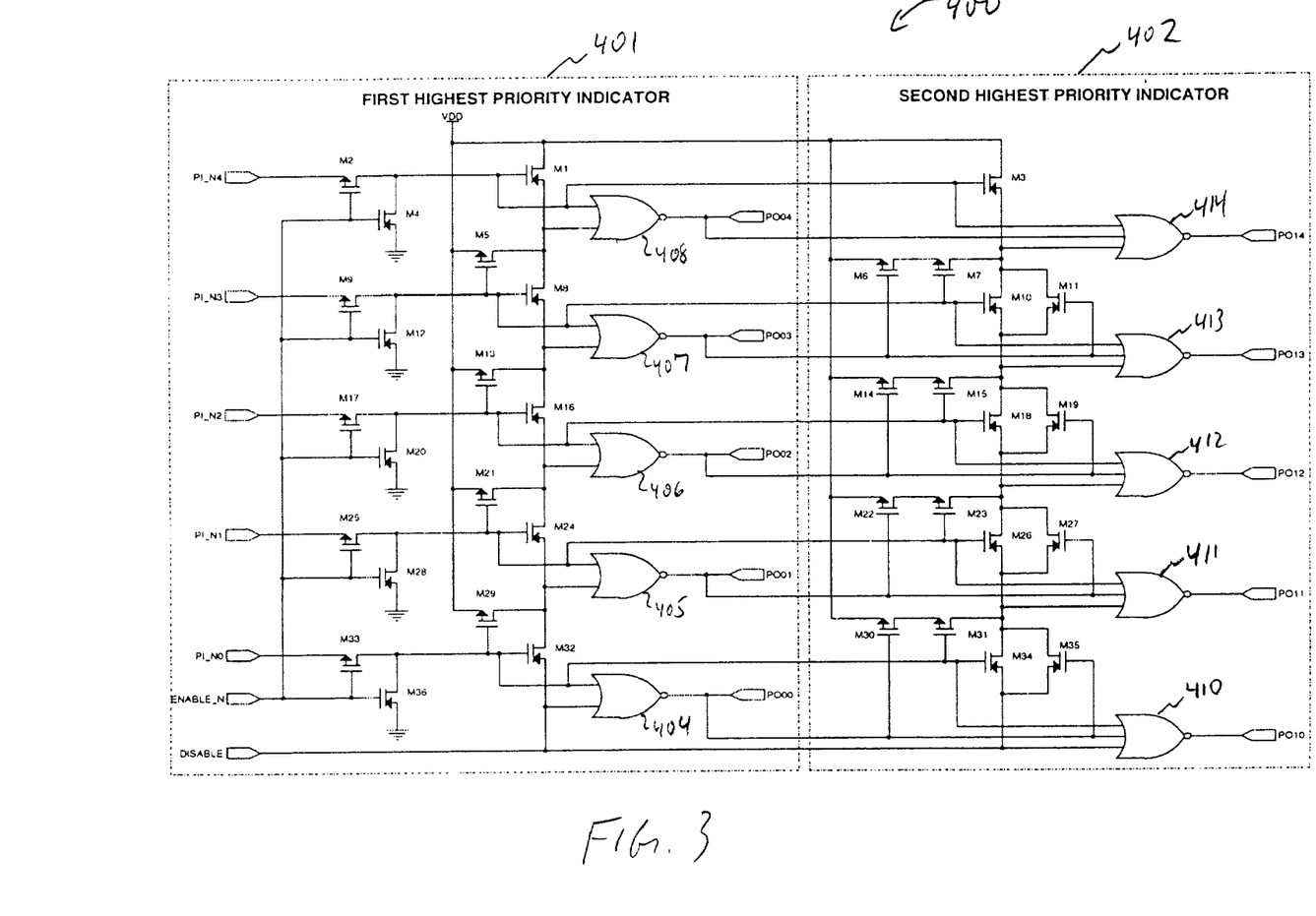
FIG. 3 illustrates a highest priority indicator according to an alternative embodiment of the present invention.

FIG. 3 shows an alternative embodiment for a multi-priority encoder 400, in which two levels of priority are encoded. Encoder 400 includes a first highest priority indicator 401 and a second highest priority indicator 402. Referring to FIG. 3, a priority encoder 400 according to an alternative embodiment of the invention is shown. Encoder 400 includes a serial arrangement of two highest priority indicators 401 and 402, each of which utilizes transistors to create a dynamic thermometer segment which propagates a logic LOW signal to indicate a priority match.

As shown in FIG. 3, first highest priority indicator 401 includes match lines PI_N0-PI_N4, p-channel pass transistors M2, M9, M17, M25, M33, n-channel transistors M4, M12, M20, M28, and M36, p-channel pass transistors M5, M13, M21, and M29, and n-channel transistors M1, M8, M16, M24, and M32. The match input data from a CAM (not shown) is supplied on lines PI_N0-PI_N4, and priority results are provided by the outputs of NOR gates 404-408 to second highest priority indicator 402. Priority results also are provided on priority outputs PO00-PO04. An ENABLE_N input and $V_{DD}$ also are provided.

Second highest priority indicator 402 includes match lines PI_N0-PI_N4, p-channel pass transistors M6, M14, M22, and M30, coupled in series with p-channel pass transistors M7, M15, M23, and M31. N-channel transistor M3, and paired couplings of n-channel transistors M10 and M11, M18 and M19, M26 and M27, and M34 and M35 couple the outputs of NOR gates 404-408 to three-input NOR gates 410-414. Priority result signals from second highest priority indicator 402 are provided on output signal lines PO10-PO14.

Highest priority indicators 401 and 402 are arranged such that only the highest priority input line having a match will produce a HIGH signal on its associated NOR gate in each highest priority indicator. In first highest priority indicator 401, for example, if an active LOW signal indicating a match is present on match lines PI_N1 and PI_N2, a logic 1 will result only on PO01, and passage of the match signal to second highest priority indicator 402 will be blocked. In the example, only the signal on line PI_N2 will be passed along to the second highest priority indicator 402. This will result in a second highest priority output (logic 1) on output PO12.

Figure 4:
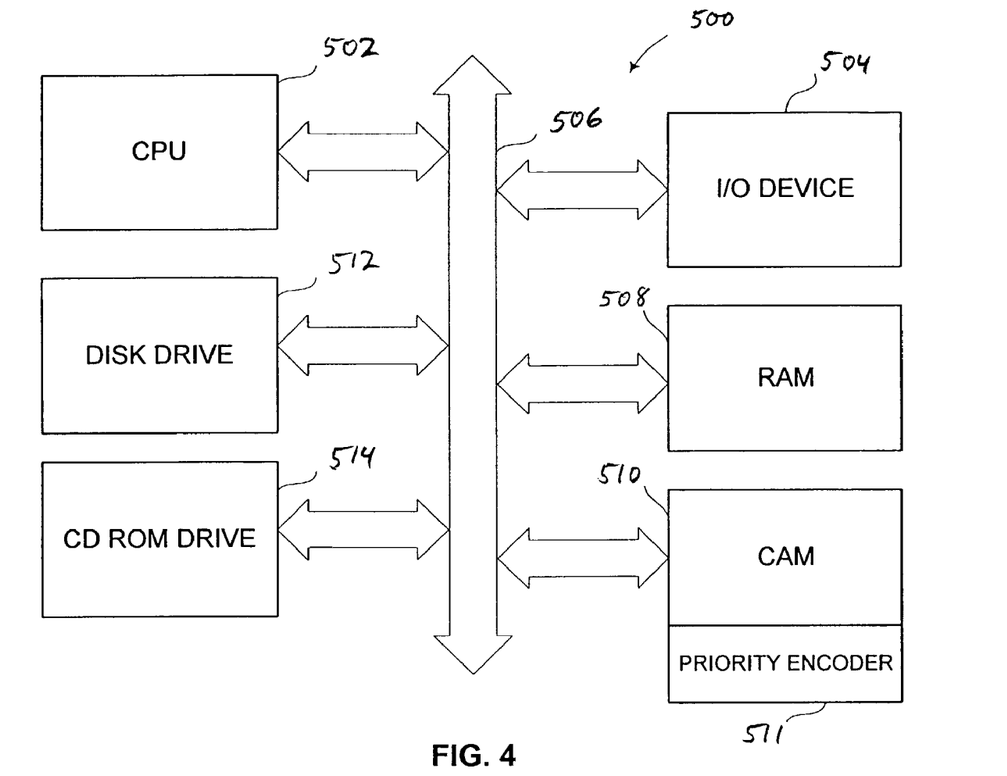
FIG. 4 illustrates a microprocessor based system which includes a CAM having a priority encoder according to an exemplary embodiment of the present invention.

Referring to FIG. 4, a processor system 500 is represented which uses a CAM 510 employing a multi-match priority encoder 511 according to the present invention. Processor system 500 generally comprises a central processing unit (CPU) 502, such as a microprocessor, that communicates with one or more input/output (I/O) devices 504 over a bus 506. The processor system 500 also includes random access memory (RAM) 508. One or more CAM devices 510 also communicate with CPU 502, CAM 510 utilizing a priority encoder 511 according to the present invention. The system may also include peripheral devices such as a floppy disk drive 512 and a compact disk (CD) ROM drive 514 which also communicate with CPU 502 over the bus 506.

Figure 5:
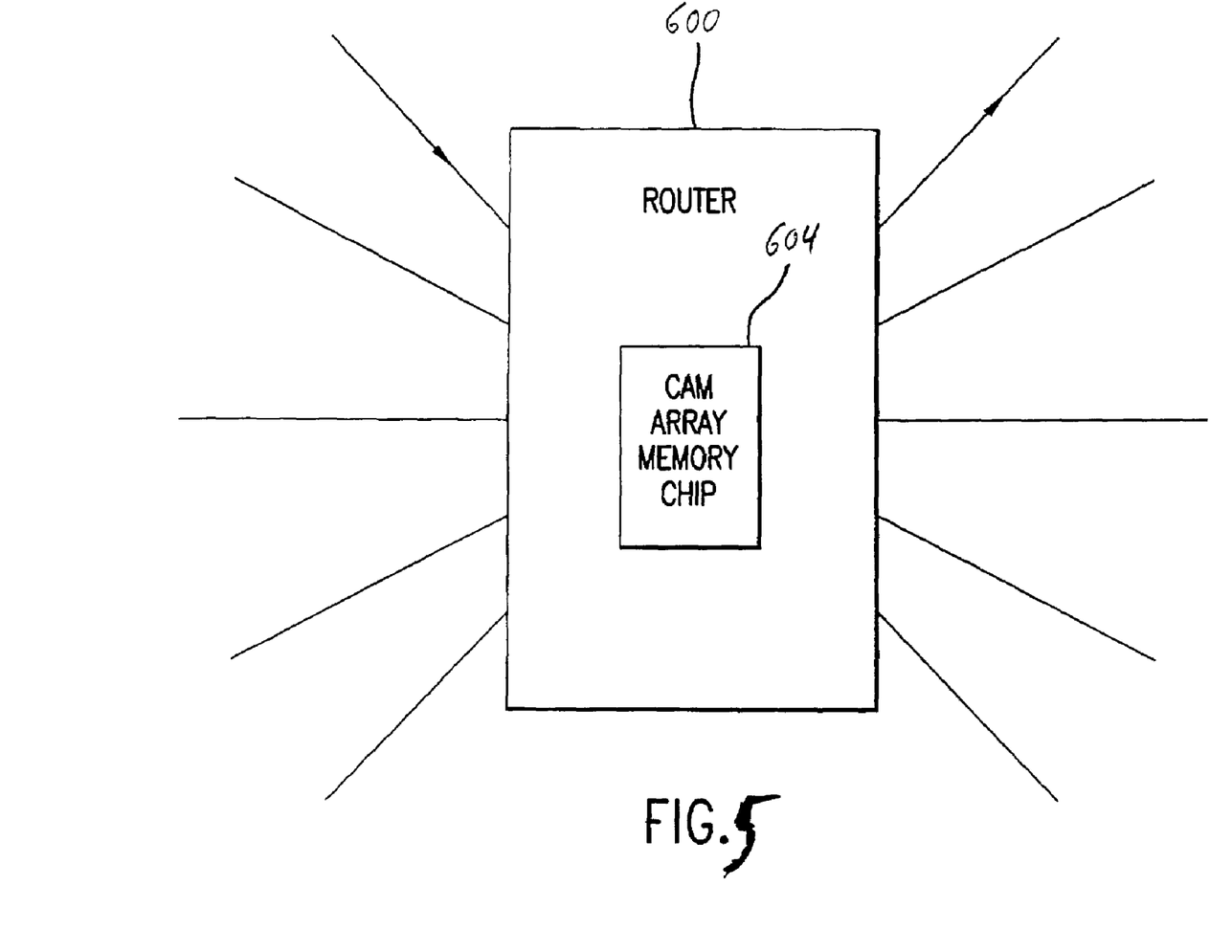
FIG. 5 illustrates a router which includes a CAM having a priority encoder according to an exemplary embodiment of the present invention.

FIG. 5 illustrates a router 600 including a CAM containing a multi-match priority encoder according to the present invention. Router 600 incorporates a CAM array memory chip 604 as may be used in a communications network, such as, e.g., part of the Internet backbone. Router 600 includes a plurality of input lines and a plurality of output lines. Data transmitted from one location to another is sent in packet form. Prior to the packet reaching its final destination, packet are received devices, such as router 600, for decoding data identifying the packet's ultimate destination, and deciding which output line and what forwarding instructions are required for the packet.

The present invention provides an apparatus and method for encoding multiple simultaneous matches in a CAM. While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A multi-priority encoder comprising:
   a plurality of interconnected, single-priority encoders arranged in descending priority order, wherein only one of the plurality of single-priority encoders is a highest-priority single-priority encoder having circuitry for receiving match line input signals, each single-priority encoder further comprising:
   multiple single-priority indicators arranged in descending priority order;
   circuitry for detecting multiple simultaneous active match line input signals received by single-priority indicators within the highest-priority single-priority encoder;
   circuitry for blocking lower priority level single-priority encoders from outputting a first match output signal corresponding to a first match line input signal, if a higher level single-priority encoder outputs the first match output signal corresponding to the same first match line input signal; and
   circuitry for allowing a lower priority level single-priority encoder to output a second match output signal corresponding to a second match line input simultaneously with the first match output signal corresponding to the first match line input such that the multi-priority encoder outputs both first and second match output signals,
   wherein each match output signal indicates a corresponding match line input signal having a determined priority.

2. The multi-priority encoder of claim 1, wherein the plurality of single-priority encoders receive match line input signals from a content addressable memory (CAM).

3. The multi-priority encoder of claim 1, further comprising address encoding circuitry for outputting the address locations of each highest priority match line flagged by a highest priority indicator.

4. The multi-priority encoder of claim 1, wherein each single-priority encoder includes a plurality of indicator segments, each indicator segment being associated with a match line input.

5. The multi-priority encoder of claim 4, wherein said circuitry comprises, in at least one of the plurality of indicator segments, a NOR gate receiving an associated match line signal, an inverter passing an enable signal to the NOR gate, and a NAND gate linking the match line signal and the enable signal to a next lower priority segment.

6. The multi-priority encoder of claim 4, wherein said circuitry comprises, in each indicator segment, an arrangement of switching transistors for receiving an associated match line signal, and linking the match line signal and the enable signal to a next lower priority segment.

7. A content addressable memory comprising:
a plurality of interconnected, single-priority encoders arranged in descending priority order, wherein only one of the plurality of single-priority encoders is a highest-priority single-priority encoder having circuitry for receiving match line input signals, each single-priority encoder further comprising:
multiple single-priority indicators arranged in descending priority order; circuitry for detecting multiple simultaneous active match line input signals received by single-priority indicators within the highest-priority single-priority encoder;
circuitry for blocking a lower priority level single-priority encoder from outputting a first active output signal corresponding to a first match line input signal, if a higher level single-priority encoder outputs the first active output signal corresponding to the same first match line input signal; and
circuitry for allowing a lower level single-priority encoder to output a second active output signal corresponding to a second match line simultaneously with the first active output signal corresponding to the first match line input such that the content addressable memory outputs both first and second active output signals indicating first and second highest priority matches, respectively,
wherein each priority match indicates a corresponding match line input signal having a determined priority.

8. A method of multi-priority encoding using a plurality of interconnected, single-priority encoders arranged in descending priority order, wherein only one of the plurality of single-priority encoders is a highest-priority single-priority encoder, each single-priority encoder including multiple single-priority indicators arranged in descending priority order, the method comprising:
simultaneously receiving a plurality of active match line input signals at the highest-priority single-priority encoder, each single-priority indicator of said highest-priority single-priority encoder receiving plurality of active match line input signals;
blocking a first active output corresponding to a first active match line input signal from lower priority level single-priority encoders if a higher priority level single-priority encoder outputs the first active output corresponding to the first active match line input signal; and
allowing a lower level single-priority encoder to output a second active output signal corresponding to a second match line input simultaneously with the first active output signal such that both first and second active outputs signals are output as first and second highest priori matches, respectively;
wherein each priority match indicates a match line input signal having a determined priority.

9. A processor system comprising:
a processor;
a content addressable memory coupled to said processor, said content addressable memory (CAM) including:
a plurality of interconnected, single-priority encoders arranged in descending priority order, wherein only one of the plurality of single-priority encoders is a highest-priority single-priority encoder receiving match line input signals from the CAM, each single-priority encoder further comprising:
multiple single-priority indicators arranged in descending priority order;
circuitry for detecting multiple simultaneous active match line input signals received by single-priority indicators within the highest-priority single-priority encoder;
circuitry for blocking lower priority level single-priority encoders from outputting a first active output signal corresponding to a first match line input signal, if a higher level single-priority encoder outputs the first active output signal corresponding to a first match line input signal on a corresponding match line; and
circuitry for allowing a lower level single-priority encoder to output a second active output signal corresponding to a second match line input simultaneously with the first active output signal such that the content addressable memory outputs both first and second active outputs indicating first and second highest priority matches, respectively,
wherein each priority match indicates a match line input signal having a determined priority.

10. The processor system of claim 9, further comprising address encoding circuitry for outputting the address locations of each highest priority match line input signal flagged by a highest priority indicator.

11. The processor system of claim 9, wherein each single-priority indicator includes a plurality of indicator stages, each indicator stage being associated with a match line input.

12. The processor system of claim 11, wherein said single-priority indicator comprises, in at lest one of the plurality of indicator stages, a NOR gate receiving an associated match line signal, an inverter passing an enable signal to the NOR gate, and a NAND gate linking the match line signal and the enable signal to a next lower priority segment.

13. A router comprising:
a plurality of message receiving inputs;
a plurality of message transmitting outputs; and
a content addressable memory (CAM) used to route messages on the inputs to the outputs, the CAM including a priority encoder having a plurality of interconnected, single-priority encoders arranged in descending priority order, wherein only one of the plurality of single-priority encoders is a highest-priority single-priority encoder coupled to the plurality of message receiving inputs, each single-priority encoder further comprising:
multiple single-priority indicators arranged in descending priority order;
circuitry for detecting multiple simultaneous active message input signals received by single-priority indicators within the highest-priority single-priority encoder;
circuitry for blocking lower priority level single-priority encoders from outputting a first active output signal corresponding to a first message input signal, if a higher level single-priority encoder outputs the first active output signal corresponding to the same first message input signal; and
circuitry for allowing a lower priority level single-priority encoder to output a second active output signal corresponding to a second message input signal simultaneously with the first active output signal corresponding to the first message input signal such that the content addressable memory outputs both first and second active output signals indicating first and second highest priority matches, respectively, wherein each priority match indicates a message receiving input having a determined priority.

14. The router of claim 13, further comprising address encoding circuitry for outputting the address locations of each highest priority message input signals flagged by a highest priority indicator.

15. The router of claim 13, wherein each single-priority indicator includes a plurality of indicator stages, each indicator stage being associated with a message input.

16. The router of claim 15, wherein said circuitry comprises, in at least one of the plurality of indicator stages, a NOR gate receiving an associated message input signal, an inverter passing an enable signal to the NOR gate, and a NAND gate linking the message input signal and the enable signal to a next lower priority segment.

* * * * *

UNITED STATES PATENT AND TRADEMARK OFFICE
CERTIFICATE OF CORRECTION

| | | |
|---|---|---|
| PATENT NO. | : 7,991,947 B2 | Page 1 of 1 |
| APPLICATION NO. | : 10/330204 | |
| DATED | : August 2, 2011 | |
| INVENTOR(S) | : Zvi Regev | |

It is certified that error appears in the above-identified patent and that said Letters Patent is hereby corrected as shown below:

In column 6, line 56, in Claim 4, delete "single- priority" and insert -- single-priority --, therefor.

In column 7, line 3, in Claim 7, delete "comprising," and insert -- comprising: --, therefor.

In column 7, line 41, in Claim 8, after "receiving" insert -- one of said --.

In column 7, line 52, in Claim 8, delete "priori" and insert -- priority --, therefor.

In column 8, line 30, in Claim 12, delete "lest" and insert -- least --, therefor.

Signed and Sealed this
Twenty-seventh Day of September, 2011

David J. Kappos
*Director of the United States Patent and Trademark Office*